| United States Patent [19] | [11] Patent Number: 4,849,059 |
| Deresh et al. | [45] Date of Patent: Jul. 18, 1989 |

[54] AQUEOUS ELECTROPLATING BATH AND METHOD FOR ELECTROPLATING TIN AND/OR LEAD AND A DEFOAMING AGENT THEREFOR

[75] Inventors: Lev Deresh, Waterbury; William R. Kelly, III, Bristol, both of Conn.

[73] Assignee: MacDermid, Incorporated, Waterbury, Conn.

[21] Appl. No.: 243,692

[22] Filed: Sep. 13, 1988

[51] Int. Cl.[4] .......................... C25D 3/32; C25D 3/36; C25D 3/60; B01F 17/42
[52] U.S. Cl. ..................................... 204/44.4; 204/53; 204/54.1; 252/352
[58] Field of Search ................ 252/352; 204/DIG. 1, 204/44.4, 53, 54.1

[56] References Cited

U.S. PATENT DOCUMENTS

| 3,299,112 | 1/1967 | Bailey | 252/352 X |
| 3,769,182 | 10/1973 | Beckwith | 204/43 S |
| 4,118,289 | 10/1978 | Hsu | 204/43 S |
| 4,384,930 | 5/1983 | Eckles | 204/43 S |
| 4,565,609 | 1/1986 | Nobel et al. | 204/44.4 |
| 4,565,610 | 1/1986 | Nobel et al. | 204/44.4 |
| 4,582,576 | 4/1986 | Opaskar et al. | 204/44.4 |
| 4,599,149 | 7/1986 | Nobel et al. | 204/44.4 |
| 4,617,097 | 10/1986 | Nobel et al. | 204/44.4 |
| 4,662,999 | 5/1987 | Opaskar et al. | 204/44.4 |
| 4,701,244 | 10/1987 | Nobel et al. | 204/44.4 |

FOREIGN PATENT DOCUMENTS 1228799  4/1971  United Kingdom ............... 252/352

OTHER PUBLICATIONS

Dohi et al., Bright Solder and Indium Plating from Methane Sulfonic Acid, Proceedings of Electroplating Seminar, Jul., 1978.
Dohi et al., Electrodeposition of Bright Tin-Lead Alloys from Alkanolsulfonate Baths, Proceedings of Interfinish 80.

Primary Examiner—G. L. Kaplan
Attorney, Agent, or Firm—St. Onge Steward Johnston & Reens

[57] ABSTRACT

Tin, lead or tin-lead alloy electroplating baths producing little or no foam during electroplating, even at conditions of high-speed plating using high current densities and/or vigorous bath circulation, are disclosed comprised of tin and/or lead salts of alkane sulfonic acids, free alkane sulfonic acid, brightening agent, a deforming agent comprised of silicone and silica and/or a silicate in polypropylene glycol, a first nonionic surfactant consisting of an ethoxylated arylphenol and a second nonionic surfactant consisting of an ethoxylated short-chain alcohol.

11 Claims, No Drawings

AQUEOUS ELECTROPLATING BATH AND METHOD FOR ELECTROPLATING TIN AND/OR LEAD AND A DEFOAMING AGENT THEREFOR

BACKGROUND OF THE INVENTION

The present invention relates to the electrodeposition of tin, lead and tin-lead alloys, and more particularly to aqueous baths for the electrodeposition of tin, lead or tin-lead alloys and methods for electrodepositing employing such baths. Still more particularly, the invention relates to reduced foaming baths for the electrodeposition of tin, lead or tin-lead alloys.

Coatings of tin and/or lead are desirable in the fabrication of a variety of electronic devices, circuits and connectors, such as printed circuits or integrated circuits, as protective layers, etch-resistant materials, stable surfaces for soldering, and the like.

Many aqueous baths for the electrodeposition of coatings of tin and/or lead are known and available in the art. Typical baths include aqueous acidic baths based upon fluoborate or fluosilicate electrolytes (see, e.g., Beckwith U.S. Pat. No. 3,769,182 et al. and Hsu U.S. Pat. No. 4,118,289). Of somewhat more recent vintage are aqueous acidic baths based upon alkanesulfonic acid or alkanolsulfonic acid electrolytes. See, e.g., Dohi et al., "Bright Solder And Indium Plating From Methane Sulfonic Acid", Proceedings of Electroplating Seminar, July, 1978; Dohi, et al., "Electrodeposition Of Bright Tin-Lead Alloys From Alkanolsulfonate Baths", Proceedings of Interfinish 80; Opaskar U.S. Pat. No. 4,582,576, et al.; Opaskar U.S. Pat. No. 4,662,999 et al.; Nobel U.S. Pat. Nos. 4,565,609; 4,565,610; 4,599,149; 4,617,097; and 4,701,244,, et al. The foregoing patents are incorporated herein by reference. Generally speaking, the baths based upon alkane- or alkanolsulfonic acids are preferred since baths containing fluoborates are corrosive and require care in handling and operation due to concerns regarding toxicity.

For obvious economic reasons, high-speed electroplating of tin, lead and tin-lead alloys is quite desirable. In seeking to achieve this goal, electroplating is desirably conducted at very high current densities. As a consequence, there occurs a fairly vigorous evolution of hydrogen gas at the plated surfaces in the form of fine bubbles, and these bubbles produce a dense foam on the surface of the electroplating bath, particularly in the presence of surfactants which are commonly employed in tin and/or lead baths to solubilize brightening agents and/or to attain improved smoothness and levelling of the metal deposit. This effect is attenuated by the common practice of establishing a vigorous circulation of the plating bath as a means for further increasing the speed of electroplating. Indeed, it is not uncommon to encounter dense foams rising several feet from the electrolyte in the collecting tank.

Excessive foam formation during electroplating can lead to non-uniform plating, increased consumption of plating bath materials, and increased drag-out of the plating solution. In situations where foam height is significant, risk exists that the foam will end up in ventilation systems, leading to obvious loss of material and corrosion of the exhaust systems.

To deal with foam formation at the surface of electroplating solutions it is not uncommon to spray a defoaming agent directly into the foam so as to reduce surface tension and break down the foam. The effects of such defoaming techniques are generally of only short duration, however, and it is therefore necessary to repeat this periodic spraying throughout the electroplating cycle, a time-consuming procedure at best. Moreover, because most defoaming agents are insoluble in water and in typical aqueous tin and/or lead electroplating baths, excessive incorporation of defoaming agent by spraying into the foam eventually results in a film of defoamer being formed on the bath surface, which film ends up on the surface of plated parts as they are removed from the bath. This film leaves noticeable, undesirable stains on the surface of bright deposits and, for tin and/or lead deposits, adversely affects the reflow of such deposits.

It would be advantageous if tin and/or lead electroplating baths could be formulated so as to be inherently low foaming even at high current densities and under vigorous agitation. One possible means for achieving this result is to choose surfactants (used, e.g., to solubilize or disperse brighteners in the bath and/or to promote levelling and smoothness) which are inherently low-foaming. See, e.g., Eckles U.S. Pat. No. 4,384,930. Typically, however, the low foaming ability of such surfactants is insufficient to prevent excessive foaming at conditions of high-speed plating. Direct incorporation into the bath of defoaming or foam inhibiting agents is also problematic due to the earlier-noted insolubility of such agents at plating bath conditions.

SUMMARY OF THE INVENTION

According to the present invention there is provided an aqueous, acidic electroplating bath for the electroplating of tin, lead or tin-lead alloys, which bath possesses the inherent capability of producing little or no foam during the electroplating process, even under high-speed plating conditions as brought about by high current densities and/or vigorous circulation of the bath, and which bath produces uniformly excellent tin and/or lead deposits. Methods for the electrodeposition of tin and/or lead deposits using the foregoing bath also are provided.

The electroplating bath according to the invention is an aqueous, acidic bath which comprises, as its fundamental components:

(a) a bath-soluble metal salt selected from the group consisting of a divalent tin salt of an alkanesulfonic acid, a divalent lead salt of an alkanesulfonic acid, and a mixture of a divalent tin salt of an alkanesulfonic acid and a divalent lead salt of an alkanesulfonic acid;

(b) a bath-soluble alkanesulfonic acid;

(c) a brightening agent;

(d) a defoaming agent comprised of a mixture of silicone and either silica and/or a silicate, in polypropylene glycol solution;

(e) a nonionic ethoxylated arylphenol surfactant; and (f) a nonionic ethoxylated short chain alcohol surfactant.

Tin and/or lead electroplating baths prepared from the foregoing components, when employed over a wide range of plating conditions, including high current densities and vigorous circulation, exhibit little or no foam formation and produce excellent tin and/or lead electroplated deposits.

Of critical importance to the operability of the baths of the present invention vis-a-vis low foaming is the conjoint presence of the defoaming agent and the two nonionic surfactants. The defoaming agent itself possesses the inherent general capability of breaking and- /or inhibiting foams. However, in the absence of the specific nonionic surfactants, the defoaming agent does not adequately confer its inherent defoaming properties to the bath because it readily "oils out" and resides, as a film, on the bath surface. Being non-uniformly dispersed throughout the bath, the effectiveness of the defoaming agent is minimized and, worse still, as plated parts are removed from the bath they acquire an undesirable film which detracts from appearance and processability (e.g., reflow). The nonionic surfactants employed herein uniquely serve to disperse the defoaming agent and prevent its oiling out. Still further, the particular defoaming agent employed exhibits uniqueness in being able to be dispersed by the particular surfactants and in resisting oiling out in conjunction with those surfactants. Finally, and importantly, the particular defoaming agent and nonionic surfactants are compatible with the remaining bath ingredients so as to achieve other desired functions (e.g., effective solubilizing of brightener, production of smooth levelled deposits) and not interfere with the operability of the bath over a wide range of plating conditions in producing suitable tin and/or lead deposits.

Electroplating baths according to the invention can be employed in electroplating processes operated over a wide range of conditions, typically at temperatures ranging from 15° C. to 35° C., and current densities ranging from 1 to 500 A/ft$^2$.

Apart from the earlier-noted essential bath components, the electroplating bath of the present invention may further contain a variety of additives designed to improve operation of the bath in producing desirably smooth and/or bright platings at particular operating conditions, and particularly at high current densities.

DETAILED DESCRIPTION OF THE INVENTION

The alkane sulfonic acids utilized in the present invention are those corresponding to the formula $RSO_3H$, wherein R is an alkyl group. Since the acids employed must be soluble in the aqueous plating bath at typical plating conditions, R generally will be an alkyl group having from 1 to 12 carbon atoms, preferably from 1 to 6 carbon atoms. Thus, typical such acids are methane sulfonic acid, ethane sulfonic acid, propane sulfonic acid, 2-propane sulfonic acid, butane sulfonic acid, 2-butane sulfonic acid, pentane sulfonic acid, hexane sulfonic acid and the like, with methane and ethane sulfonic acids being most preferred. Mixtures of these acids also may be employed.

Depending upon the type of plating desired, i.e., tin, lead or a tin-lead alloy, the electroplating bath also will contain a divalent tin or divalent lead salt of an alkane sulfonic acid or a mixture of such tin and lead salts, based upon the same sulfonic acids described above. Typically, the metal salts will be based upon the same alkane sulfonic acid utilized as the free acid in the bath, e.g., tin and/or lead salts of methane sulfonic acid employed along with free methane sulfonic acid, but salts based upon an alkane sulfonic acid or acids differing from that or those used as the free acid also can be used. The tin and/or lead salts also can be mixtures of salts based upon different alkane sulfonic acids and, for tin-lead plating, the tin and lead salts need not necessarily be based upon the same sulfonic acid.

The total concentration of tin and/or lead ions in the bath as provided by the alkane sulfonic acid salts thereof can vary over a wide range, but typically will be within the range of from about 0.5 to about 300 grams per liter, most typically within the range of from about 5 to about 150 grams per liter, and preferably from about 8 to 100 grams per liter. The concentration of the free alkane sulfonic acid in the bath generally will be in the range of from about 10 to 500 grams per liter, and preferably from about 50 to 250 grams per liter.

The electroplating bath of the present invention contains at least one brightening agent effective to produce bright tin and/or lead metal deposits over a range of, or at particular, bath operating conditions. Typical such brightening agents include aromatic aldehydes such as benzaldehydes, naphthaldehydes, pyridinecarboxaldehydes and furaldehydes, which may contain one or more nitro, halo, amino, alkoxy or lower alkyl groups substituted for hydrogen in the ring, and more particularly, α-naphthaldehyde or o-chlorobenzaldehyde or 2-naphthaldehyde or 2-methoxy-1-naphthaldehyde or the like. Other brightening agents include acetophenones and their halide derivatives, and carbonyl compounds corresponding to the general formula $R_4$—C(H)=C(H)—C(O)CH$_3$, where $R_4$ is an aromatic group such as phenyl, naphthyl, pyridyl, thiophenyl or furyl which may contain one or more hydroxyl, alkoxy or halo groups substituted for hydrogen in the ring, such as benzylidene acetone. Still further brightening agents include the lower aliphatic aldehydes such as acetaldehyde, propionaldehyde and the like, and alpha unsaturated carboxylic acids, amides or esters, such as acrylic acid, methacrylic acid, ethyl acrylate and the like.

Most typically, the electroplating bath will contain at least one brightening agent selected from the aromatic aldehydes and the previously-noted aromatic carbonyl compounds, such as α-naphthaldehyde and benzylidene acetone or other like compounds. As earlier noted, brightening agents are usually chosen for their effectiveness in producing desirably smooth and bright deposits over either particular or broad bath operating ranges. Use of particular brightening agents can effectively "extend" the useful range of current densities for plating by providing desirable platings at particularly low or particularly high current densities. For example, it has been found that inclusion of propionaldehyde along with aromatic aldehydes and/or aromatic carbonyl compounds permits the bath to be operated at very high current densities while still producing smooth, bright deposits. In the preferred baths of the invention, the brightening agent comprises a combination of at least one aromatic aldehyde or aromatic carbonyl compound and at least one lower aliphatic aldehyde (preferably propionaldehyde) or alpha unsaturated carboxylic acid, ester or amide.

Concentrations of brightening agents in the electroplating baths of the present invention may vary widely depending upon the other bath components, the desired brightness of the plating, and the bath operating conditions. Typically, the concentration of the aromatic aldehydes and/or aromatic carbonyl brighteners will be in the range of from about 0.02 to about 5.0 grams per liter, while the lower aliphatic aldehydes will typically be used at a concentration of from about 0.1 to about 10 grams per liter. The concentration range of any particular brightener also will, of course, be affected by the presence of any other brighteners in the bath and the concentration thereof.

The electroplating bath of the present invention lastly contains, as essential ingredients, a combination of nonionic surfactants and a defoaming agent which result in the bath exhibiting little or no foaming even under operating conditions designed to promote high-speed plating, such as utilization of high current densities and vigorous bath circulation. At the same time, the surfactants are useful in promoting solubilization and dispersion of otherwise difficulty-soluble or difficultydispersible brightening agents.

The defoaming agent employed in the electroplating bath of the present invention is a mixture of silicone and either silica and/or a silicate, all in polypropylene glycol solution. The silicone may be any of the generally known and available organic polysiloxane polymers having the characteristic

repeating structure, or mixtures thereof, and the silicate can be any of the well-known silicon/oxygen/metal combinations, most of which are naturally occurring, or mixtures thereof. Generally the proportions of silicone and either silica and/or silicate can range between 20:80 and 80:20, and the total concentration of such materials in the polypropylene glycol solution typically will range from about 2 to 30% by weight, most preferably about 8-12% by weight. Generally, the defoaming agent will be present in the bath at a concentration of from about 0.01 to 5.0 g/l, preferably from about 0.1 to 0.6 g/l.

The first nonionic surfactant employed in the electroplating bath of the present invention is a liquid, bathsoluble ethoxylated arylphenol corresponding to the structural formula:

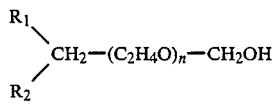

wherein $R_1$ and $R_2$ are phenyl or alkylphenyl and n is an integer from 6 to 15, preferably from about 8 to 10. Compounds according to this structure are known and available in the art and may be readily prepared by reaction between ethylene oxide and the particular arylphenol base substituent. Generally, this nonionic surfactant will be employed in the bath at a concentration of from about 1 to 15 grams per liter, and most preferably from about 4 to 10 grams per liter depending upon the amount of defoaming agent employed, the concentration and type of brightening agent employed, the amount of the second nonionic surfactant employed, and the bath operating conditions.

The second nonionic surfactant employed in the electroplating bath of the invention is a liquid, bathsoluble ethoxylated short-chain alcohol corresponding to the general structural formula:

$R_3(C_2H_4O)_xCH_2OH$ wherein $R_3$ is an alkyl group having from 1 to 10 carbon atoms and x is an integer from 6 to 15, preferably from 8 to 10. Compounds corresponding to this structure are known and available in the art and may be prepared by reaction between ethylene oxide and the alcohol base substituent. Generally this second nonionic surfactant is present in the bath at a concentration of from about 1 to about 15 grams per liter, preferably from about 1 to 4 grams per liter, and typically is in an amount less than that of the first nonionic surfactant such that the ratio between the two is from about 2:1 to about 4:1. As with the first surfactant, the concentration of the second surfactant in the bath is dependent upon the concentration of defoaming agent, the concentration and type of brightening agent, the concentration of the first surfactant, and the bath operating conditions.

As earlier noted, the combination of the particular defoaming agent and the particular nonionic surfactants appears to be unique in producing tin and/or lead electroplating baths, based upon alkane sulfonic acid electrolytes, which can be operated under high-speed plating conditions with little or no foam formation and without oiling out of the defoaming agent in the form of a film along the surface of the bath. A number of other defoaming agents tested, all possessing inherent foam-breaking or foam-inhibiting ability, when employed with the particular combination of nonionic surfactants abovedescribed, were not effective in reducing foaming and/or resisting oiling out under high-speed plating conditions. Conversely, a number of other common nonionic surfactants, employed alone and in combination, and used with the defoaming agent abovedescribed, were ineffective in preventing oiling out of the defoaming agent. Still further, neither of the nonionic surfactants employed in the bath of the present invention possesses the ability, alone, to prevent oiling out of the defoaming agent.

Equally surprising and advantageous is that the nonionic surfactants found useful for solubilizing and dispersing the defoaming agent herein are equally effective in solubilizing and dispersing otherwise difficulty-soluble brightening agents and in promoting smooth, levelled, bright deposits of tin and/or lead. Accordingly, it is not necessary to resort to additional, different nonionic, anionic or cationic surfactants or wetting agents to achieve such aims in the baths of this invention, although inclusion thereof is not prohibited as such where some advantage or benefit is gained thereby.

The electroplating baths of the present invention may, of course, contain ingredients beyond those essential ingredients described herein as may be necessary or expedient to achieve particular goals or effects. For example, it is known to add reducing agents to tin or tin-lead baths as a means for maintaining tin in its soluble divalent state.

The electroplating baths of the present invention generally are formulated to have a pH below about 3, and preferably below about 2, as achieved by suitable choice of concentration of the alkane sulfonic acid component.

The invention is further described and illustrated with reference to the following examples.

EXAMPLE I

An aqueous tin-lead plating bath was prepared using 8.0 g/l. stannous ion (as methane sulfonic acid salt), 0.9 g/l. plumbous ion (as methane sulfonic acid salt), 150 g/l. methane sulfonic acid, 4.0 g/l. poly (oxy-1,2,ethanediyl), α-(bis(phenylmethyl)-w-hydroxy, 1.5 g/l. poly (oxy-1,2-ethanediyl),α-butyl-w-hydroxy, 0.2 g/l. of a 10% solution of silicone and silicate in polypropylene glycol, and brightening agents.

Plating was performed in a standard 267 ml. Hull cell equipped with a standard paddle agitator having a 6 cm. amplitude and a period (back and forth movement) of one second. The temperature of the bath was maintained at 20°-25° C. A panel was plated at a current of 2A for five (5) minutes, during which no foam was formed, and the plated panel had a smooth, bright deposit of tin-lead with no film evident. The bath was modified by removal of the defoaming agent and, under identical plating conditions, a dense foam about 10 mm in height formed on the surface of the bath.

EXAMPLE II

An aueous tin-lead plating bath was prepared using 50.0 g/l. stannous ion (as methane sulfonic acid salt), 25.0 g/l. plumbous ion (as methane sulfonic acid salt), 200 g/l. methane sulfonic acid, 7.0 and 2.5 g/l. respectively, of the surfactants used in Example I, 0.4 g/l. of the defoaming agent of Example I, and brightening agents including 1.0 g/l. propionaldehyde.

Using the same Hull cell of Example I, and with the bath held at a temperature between 20°-25° C., and a current of 5A for one minute, panels were plated at current densities varying from 2 to 20 amperes per square decimeter, producing bright uniform tin-lead deposits at all such densities. Up to current densities of 18A/dm$^2$ no foam formation was observed. Above this current density, a small layer of foam was produced but it was readily broken just with a paddle. Using a modified plating bath without the defoaming agent, a thick very stable layer of foam was produced at all current densities tested, with the foam overlapping the walls of the Hull cell at the higher current densities.

In terms of the essential ingredients of the present invention, it should be noted that certain nonionic surfactants are sometimes themselves referred to in the prior art as having brightening properties for tin and/or lead deposits; as used herein, however, the particular nonionic surfactants are elements separate and apart from the brightening agent and vice-versa.

Also, while the invention has been described in terms of a complete tin and/or lead electroplating bath and the components thereof, it is within the purview of the invention to provide the ultimate user of the bath with one or more separately packaged compositions which, along with additions to be made by the user (e.g., water, tin and/or lead salts, alkane sulfonic acids, etc.), in total make up the electroplating bath. In this connection, an important product of the invention is a defoamer composition, comprised of the defoaming agent described herein, the first nonionic surfactant and the second nonionic surfactant (optionally together with other ingredients) which, when used by the electroplater to make up an electroplating bath, provides the required amounts of each of these components in the bath. Typically, in such prepackaged compositions, the defoaming agent will be present in an amount of from about 0.1 to about 3.0%, the first surfactant in an amount of from about 10-20% and the second surfactant in an amount of from about 2.5-10%, all percents by weight.

Although the invention has been described with reference to particular compounds, concentrations and plating conditions, it will be apparent that departures therefrom are readily ascertainable and can be made by those of skill in this art within the spirit and scope of the invention as defined in the appended claims.

What is claimed is:

1. An aqueous acidic tin, lead or tin-lead alloy electroplating bath comprising:
   (a) a bath-soluble metal salt selected from the group consisting of a divalent tin salt of an alkanesulfonic acid, a divalent lead salt of an alkanesulfonic acid, and a mixture of a divalent tin salt of an alkanesulfonic acid and a divalent lead salt of an alkanesulfonic acid;
   (b) an alkane sulfonic acid;
   (c) a brightening agent;
   (d) a defoaming agent comprising a mixture of silicone and either silica and/or a silicate, in polypropylene glycol;
   (e) a first nonionic surfactant consisting of an ethoxylated arylphenol; and
   (f) a second nonionic surfactant consisting of an ethoxylated short-chain alcohol.

2. An aqueous acidic bath according to claim 1 wherein said metal salt of an alkane sulfonic acid is a salt of methane sulfonic acid.

3. An aqueous acidic bath according to claim 2 wherein said alkanesulfonic acid is methane sulfonic acid.

4. An aqueous acidic bath according to claim 1 wherein said brightening agent comprises an automatic carbonyl compound.

5. An aqueous acidic bath according to claim 4 wherein said brightening agent further comprises propionaldehyde.

6. An aqueous acid bath according to claim 5 wherein said brightening agent comprises a mixture of α-napthaldehyde and benzylidene acetone.

7. An aqueous acidic bath according to claim 6 wherein α-napthaldehyde is present in a concentration of from about 0.02 to about 5 g/l.; benezylidene acetone is present in a concentration of from about 0.02 to about 5 g/l.; and propionaldehyde is present in a concentration of from about 0.01 to 10 g/l.

8. An aqueous acid bath according to claim 1 wherein the total concentration of metal ions provided by the metal salts in said bath is from about 5 to about 150 g/l. and the concentration of alkanesulfonic acid is from about 50 to about 250 g/l.

9. An aqueous acidic bath according to claims 1 or 8 wherein said first nonionic surfactant is present in a concentration of from about 1 to 15 g/l., said second nonionic surfactant is present in a concentration of from about 1 to 15 g/l., and the ratio between the concentration of said first and second nonionic surfactants is from about 2:1 to about 4:1.

10. A method for depositing a bright tin, lead or tin-lead alloy on a substrate which comprises immersing at least a portion of said substrate in the aqueous acidic bath of claim 1 and electroplating tin, lead or a tin-lead alloy from said bath onto said substrate as a layer.

11. A composition for use in formulating tin, lead or tin-lead alloy electroplating baths based upon alkane sulfonic acid electrolyte, comprising a defoaming agent comprised of a mixture of silicone and either silica and/or a silicate, in polypropylene glycol, a first nonionic surfactant consisting of an ethoxylated arylphenol and a second nonionic surfactant consisting of an ethoxylated short-chain alcohol.

* * * * *